United States Patent
Jung et al.

(10) Patent No.: US 10,196,736 B2
(45) Date of Patent: Feb. 5, 2019

(54) HEATING APPARATUS, AND COATING DEVICE COMPRISING SAME

(71) Applicant: POSCO, Pohang-si, Gyeongsangbuk-do (KR)

(72) Inventors: Yong-Hwa Jung, Gwangyang-si (KR); Kyung-Hoon Nam, Gwangyang-si (KR); Mun-Jong Eom, Gwangyang-si (KR); Woo-Sung Jung, Gwangyang-si (KR); Seok-Jun Hong, Gwangyang-si (KR); Young-Jin Kwak, Gwangyang-si (KR); Tae-Yeob Kim, Gwangyang-si (KR); Dong-Yoeul Lee, Gwangyang-si (KR)

(73) Assignee: POSCO, PohangsSi, Gyeongsangbuk-do (KR)

( * ) Notice: Subject to any disclaimer, the term of this patent is extended or adjusted under 35 U.S.C. 154(b) by 125 days.

(21) Appl. No.: 14/654,505

(22) PCT Filed: Dec. 19, 2013

(86) PCT No.: PCT/KR2013/011853
§ 371 (c)(1),
(2) Date: Jun. 19, 2015

(87) PCT Pub. No.: WO2014/098489
PCT Pub. Date: Jun. 26, 2014

(65) Prior Publication Data
US 2015/0345008 A1    Dec. 3, 2015

(30) Foreign Application Priority Data
Dec. 21, 2012   (KR) ......................... 10-2012-0151520

(51) Int. Cl.
*C23C 14/24*  (2006.01)
*C23C 14/56*  (2006.01)

(52) U.S. Cl.
CPC ............ *C23C 14/24* (2013.01); *C23C 14/243* (2013.01); *C23C 14/246* (2013.01); *C23C 14/562* (2013.01)

(58) Field of Classification Search
CPC ........................... C23C 14/246; C23C 14/243
See application file for complete search history.

(56) References Cited

U.S. PATENT DOCUMENTS 2,686,864 A * 8/1954 Wroughton ............. C30B 13/20
                                                         164/258
T988,002 I4     11/1979 Ohta
(Continued)

FOREIGN PATENT DOCUMENTS

CN    102812151 A   12/2012
EP       2025773 A1    2/2009
(Continued)

OTHER PUBLICATIONS

English abstract of Derwent (account No. 1978-05375) corresponding to JP 52144383, which filed in IDS.*
(Continued)

*Primary Examiner* — Aiden Lee
(74) *Attorney, Agent, or Firm* — McDermott Will & Emery LLP

(57) ABSTRACT

Provided are a heating apparatus configured to generate a coating vapor for coating a base metal (steel sheet) which is continuously transferred in a vacuum state, and a coating device including the heating apparatus. A coating material to be converted into a coating vapor is initially supplied in a solid phase (solid state) and then phase changed into a liquid (liquid state). Thereafter, the liquid-state coating material is supplied to a heating unit, thereby preventing problems such as equipment erosion occurring when a liquid coating material is directly supplied and preventing the decrease of the temperature of a coating material when a solid wire is
(Continued)

supplied as a coating material. As a result, the energy efficiency of the heating apparatus may be maximized.

11 Claims, 8 Drawing Sheets

(56) References Cited

U.S. PATENT DOCUMENTS

| | | | | |
|---|---|---|---|---|
| 5,000,114 | A * | 3/1991 | Yanagi | C23C 14/246 118/40 |
| 5,195,651 | A * | 3/1993 | Felde | C23C 14/246 221/174 |
| 6,447,734 | B1 * | 9/2002 | Hwu | C30B 23/066 118/724 |
| 2005/0229856 | A1 | 10/2005 | Malik | |
| 2007/0189953 | A1 * | 8/2007 | Bai | B82Y 30/00 423/414 |
| 2008/0128094 | A1 * | 6/2008 | Fukuda | C23C 14/24 159/6.1 |
| 2009/0061090 | A1 * | 3/2009 | Negishi | C23C 14/12 427/255.28 |
| 2009/0148598 | A1 * | 6/2009 | Zolla | C23C 14/0623 427/251 |
| 2010/0154712 | A1 | 6/2010 | Tamura et al. | |
| 2011/0214966 | A1 * | 9/2011 | Mizokami | B65G 11/023 198/523 |
| 2013/0098453 | A1 | 4/2013 | Boger et al. | |
| 2013/0186339 | A1 | 7/2013 | Nam et al. | |
| 2014/0127406 | A1 | 5/2014 | Banaszak et al. | |

FOREIGN PATENT DOCUMENTS

| | | |
|---|---|---|
| JP | S52-144383 A | 11/1977 |
| JP | 55-154537 A | 2/1980 |
| JP | 56-081674 A | 7/1981 |
| JP | 59-038379 A | 3/1984 |
| JP | 59-177369 A | 10/1984 |
| JP | 59-177370 A | 10/1984 |
| JP | 8-134634 A | 5/1996 |
| JP | 2524622 B2 * | 8/1996 |
| JP | 09-053173 A | 2/1997 |
| JP | 2010-144221 A | 7/2010 |
| JP | 2010-189739 A | 9/2010 |
| JP | 2010-533790 A | 10/2010 |
| JP | 2012-525499 A | 10/2012 |
| JP | 2013-127086 A | 6/2013 |
| JP | 2014-501335 A | 1/2014 |
| KR | 10-2007-0015923 A | 2/2007 |
| KR | 10-2009-0074064 A | 7/2009 |
| KR | 10-2011-0035072 A | 4/2011 |
| KR | 10-2011-0038343 A | 4/2011 |
| KR | 10-2012-0074158 A | 7/2012 |
| KR | 10-1207719 B1 | 12/2012 |
| WO | 2005/116290 A1 | 12/2005 |
| WO | 2008/040329 A1 | 4/2008 |
| WO | 2009/010468 A1 | 1/2009 |
| WO | 2010/126254 A2 | 11/2010 |
| WO | 2012/091390 A2 | 7/2012 |
| WO | 2012/095489 A1 | 7/2012 |

OTHER PUBLICATIONS

International Search Report issued in International Application No. PCT/KR2013/011853 dated Mar. 3, 2014, with English Translation.
Chinese Office Action dated Jun. 27, 2016 issued in Chinese Patent Application No. 201380067426.2 (English translation).
Japanese Office Action dated Jun. 28, 2016 issued in Japanese Patent Application No. 2015-549256.
Extended European Search Report dated Dec. 18, 2015 issued in European Patent Application No. 13865017.1.
Communication Pursuant to Article 94(3) EPC issued in corresponding European Patent Application No. 13 865 017.1, dated May 22, 2017.

* cited by examiner

[Figure 1]
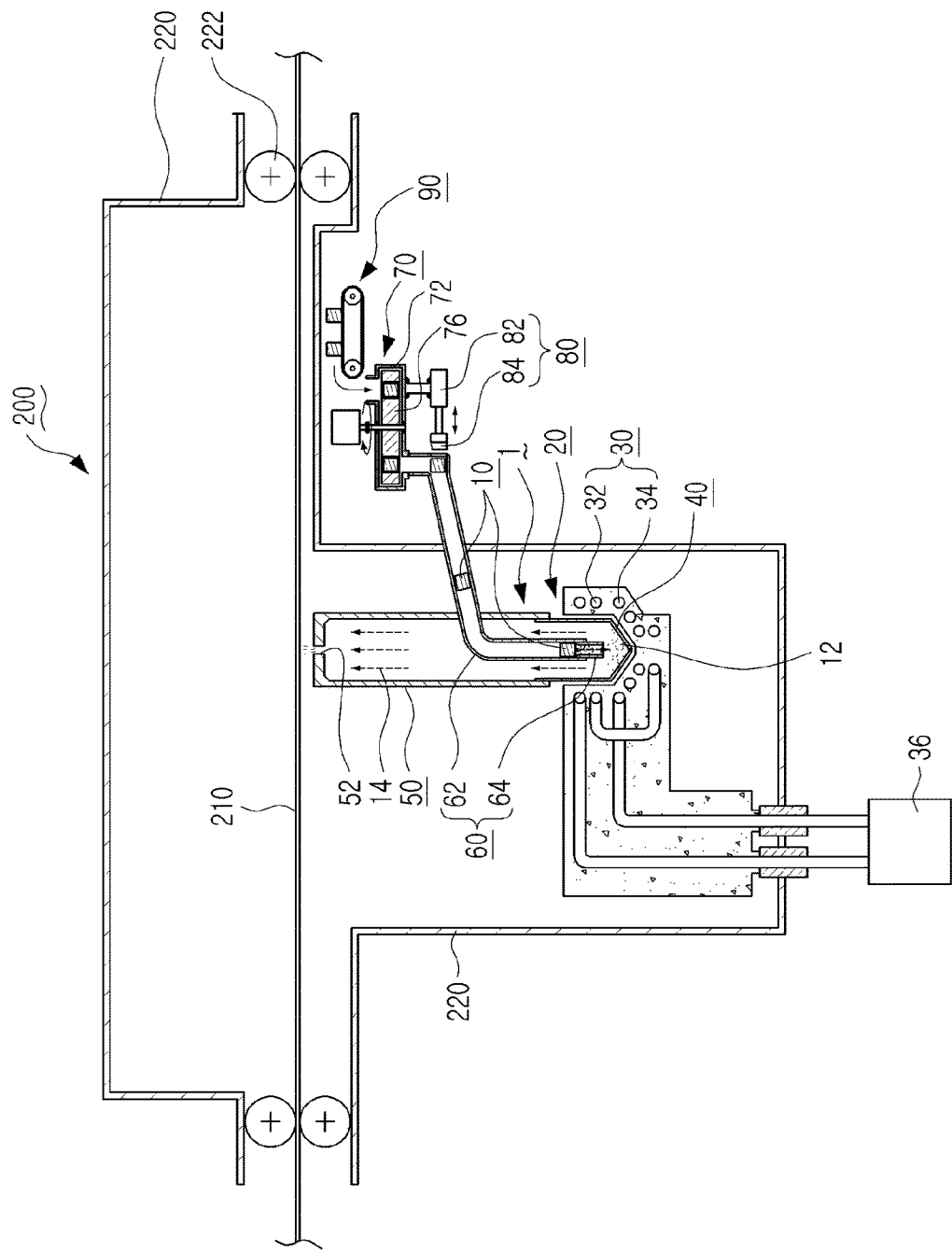

【Figure 2】
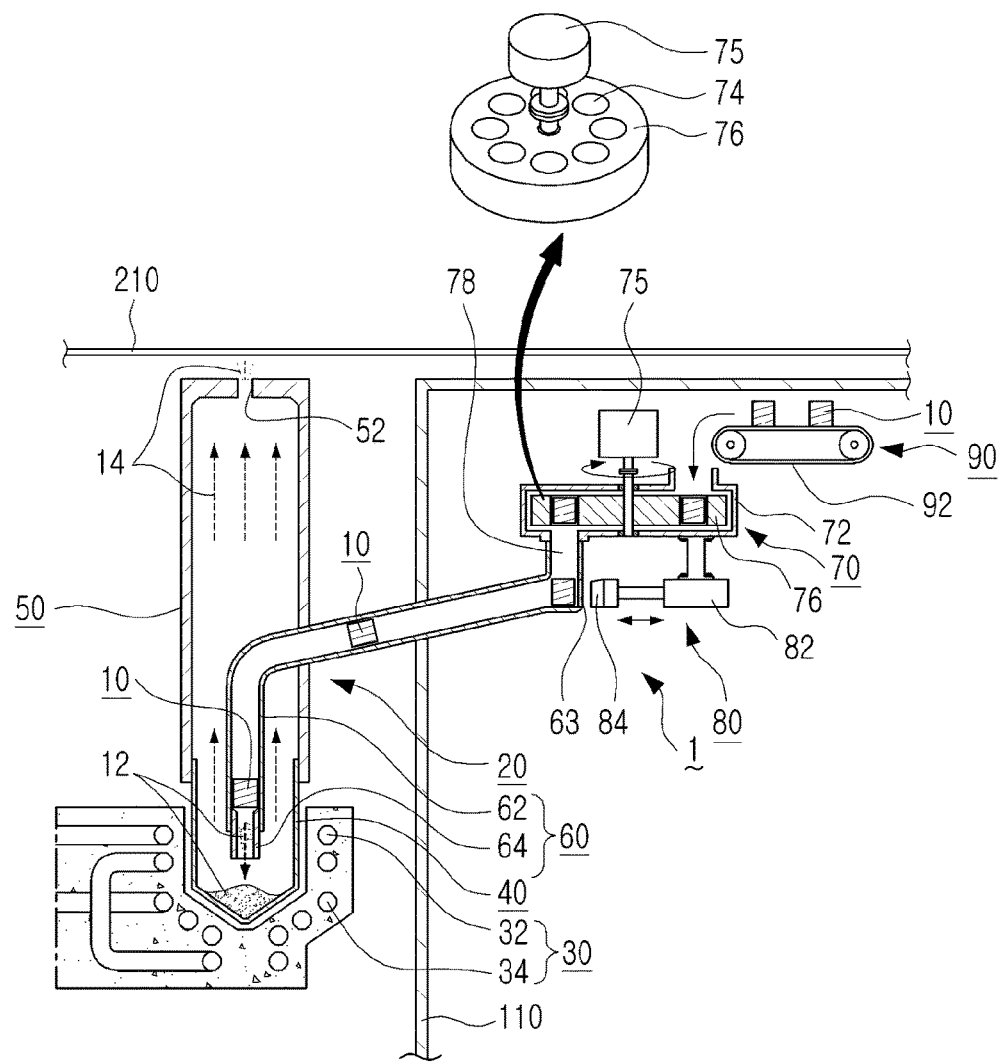

【Figure 3】
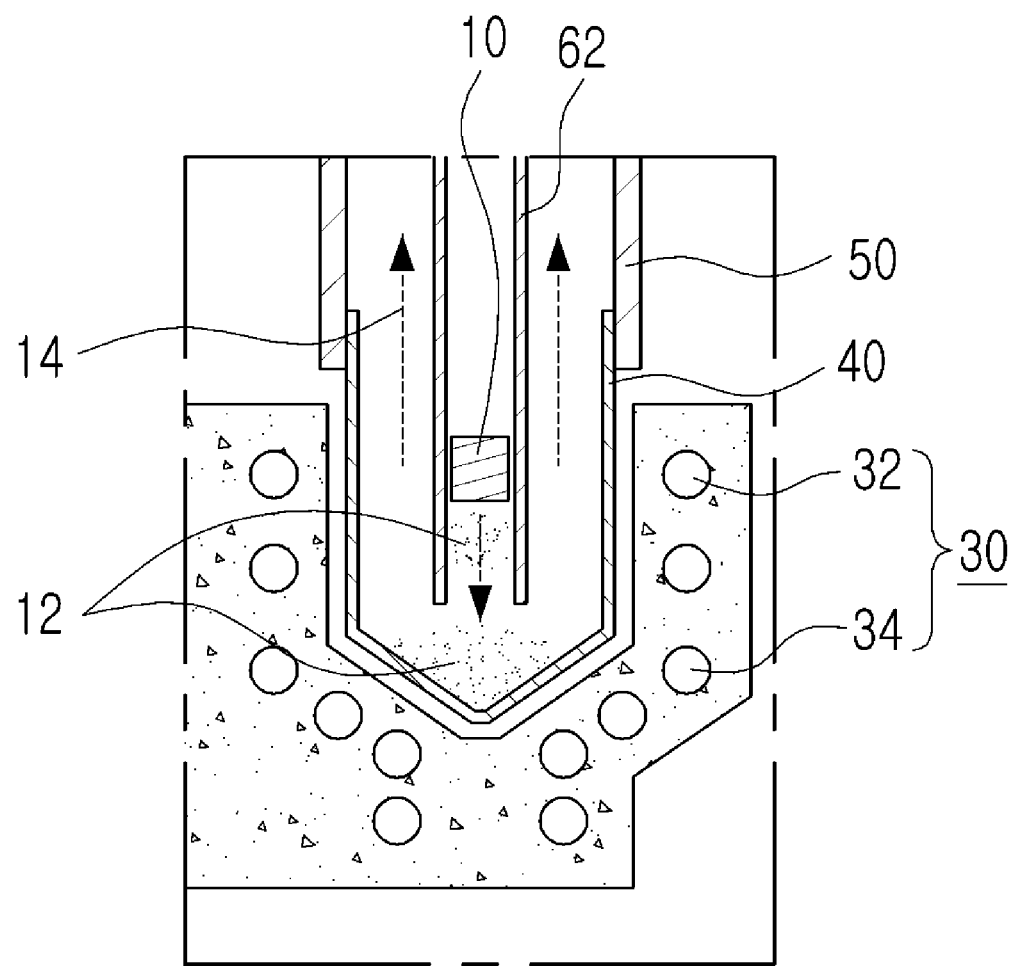

[Figure 4]
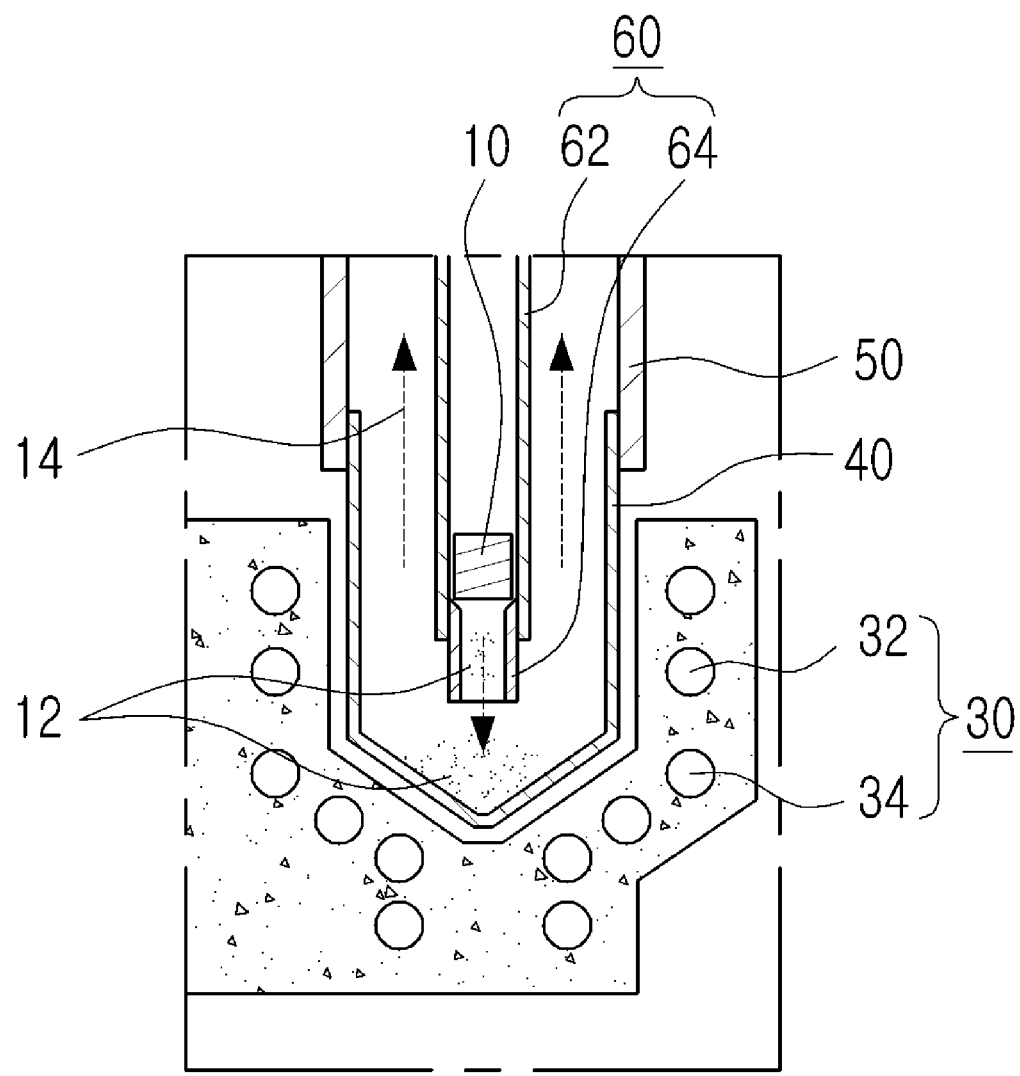

[Figure 5]
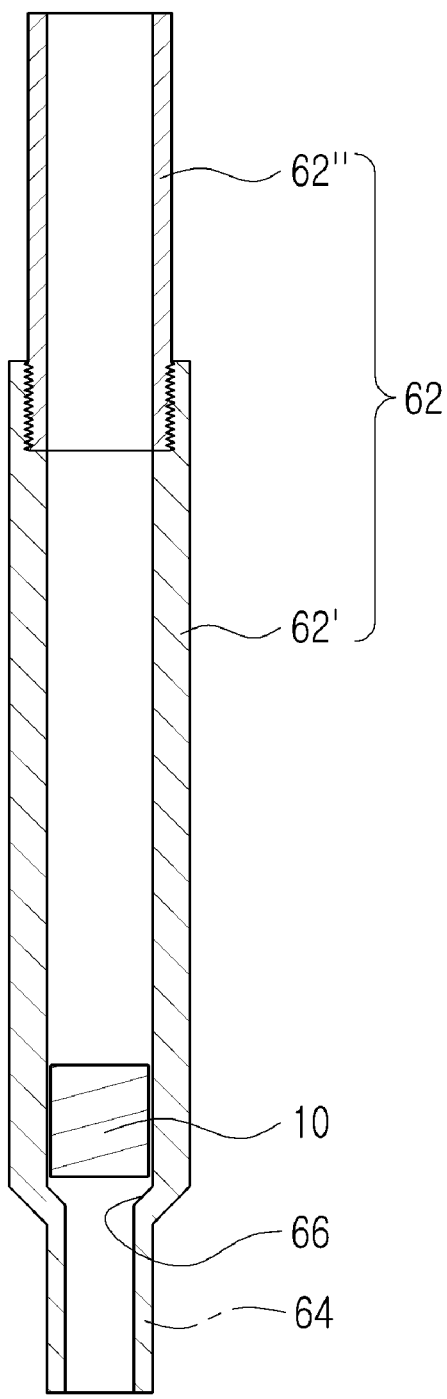

【Figure 6】
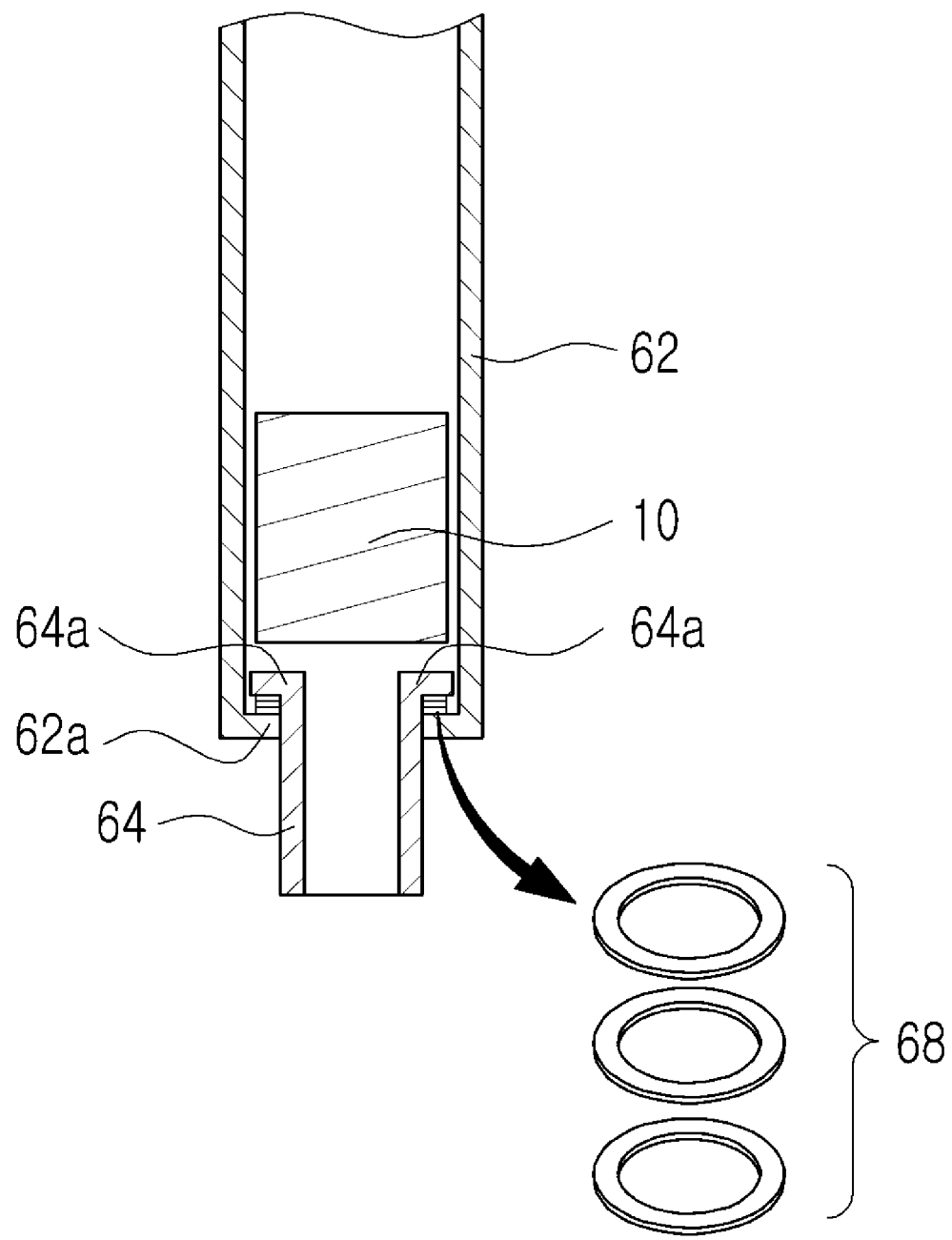

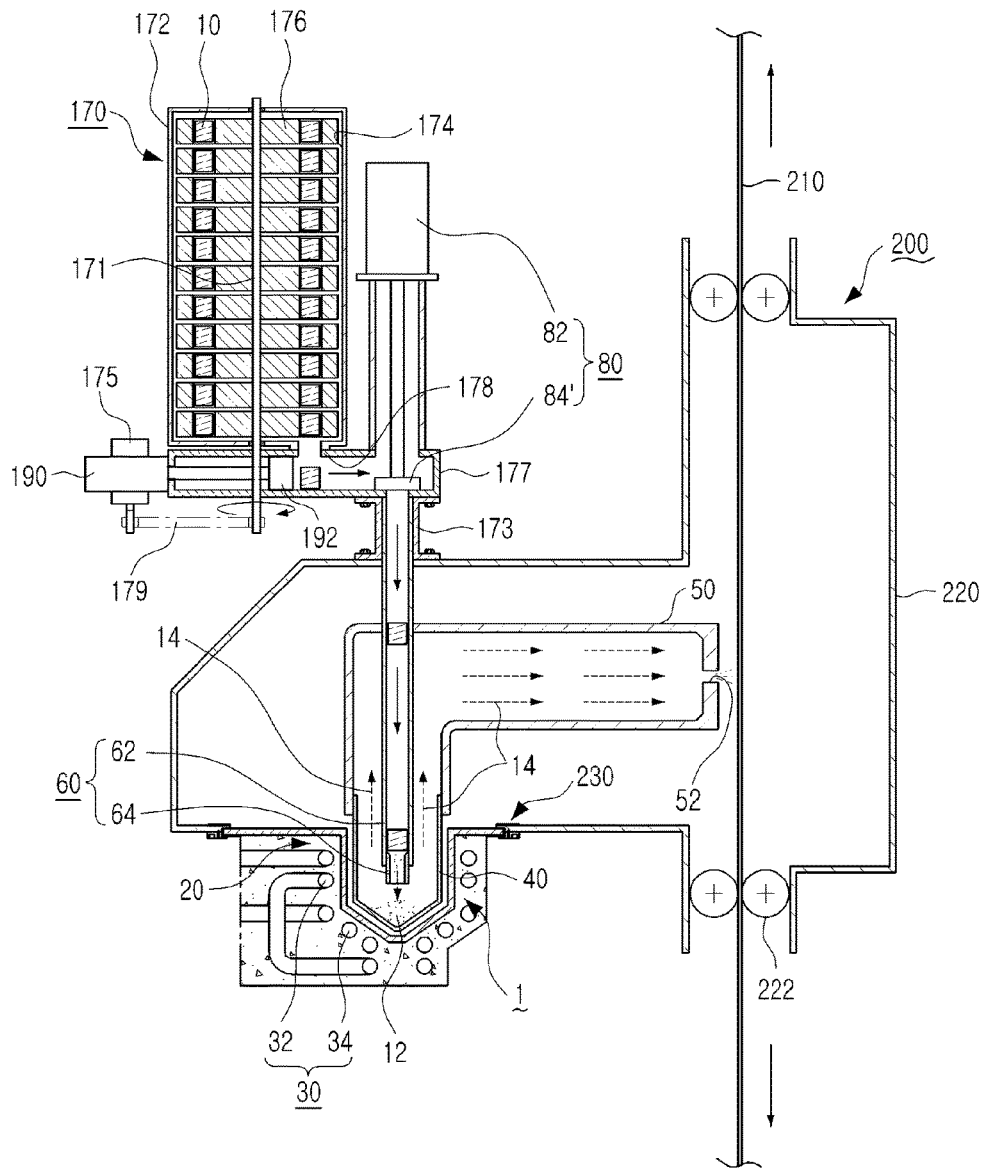
[Figure 7]

【Figure 8】
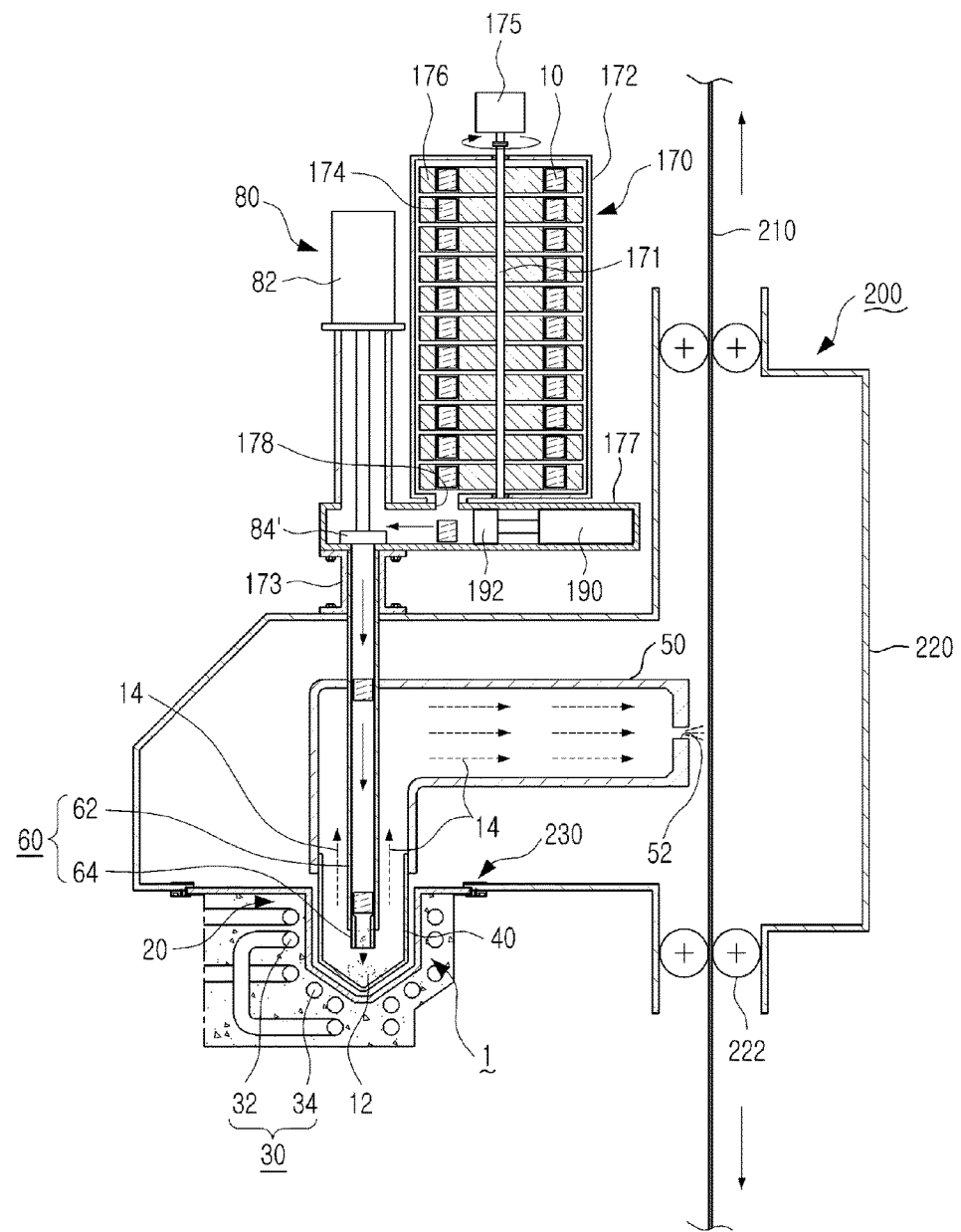

HEATING APPARATUS, AND COATING DEVICE COMPRISING SAME

RELATED APPLICATIONS

This application is a national phase of International Application No. PCT/KR2013/011853, filed on Dec. 19, 2013, which in turn claims the benefit of Korean Application No. 10-2012-0151520, filed on December 21, 2012, the disclosures of which Applications are incorporated by reference herein.

TECHNICAL FIELD

The present disclosure relates to a heating apparatus configured to generate a deposition coating vapor (gas) for coating a base metal (steel sheet) while being continuously transferred, and more particularly, to a heating apparatus and a coating device including the heating apparatus, the heating apparatus employing a liquid supply method in which a supplied solid coating material is stopped and the solid coating material is heated so as to generate a liquid coating material and supply the liquid coating material to a heating unit that converts the liquid coating material into a coating vapor, thereby reducing a temperature drop of the coating material, effectively generating a coating vapor, and improving coating quality and coating process characteristics.

BACKGROUND ART

For example, substrates or steel sheets being continuously being transferred (at high speed) may be coated with a coating material such as a metal vapor under a vacuum using a known vacuum deposition method.

In a vacuum deposition process, a solid (phase) or liquid (phase) coating material is evaporated to form vapor (gas) by various heating-evaporating methods and deposited on a steel sheet to coat the steel sheet.

Examples of such vacuum deposition methods for continuously coating substrates (steel sheets) include a thermal evaporation method and an electron beam evaporation method.

In addition, electromagnetic levitation evaporation methods have recently been researched and developed for high-speed deposition.

In an electromagnetic levitation evaporation method, a coating material is surrounded by an electromagnetic coil, and a high-frequency alternating current (AC) current is applied to the electromagnetic coil from a high-frequency power source to levitate and heat the coating material by an AC electromagnetic field. When compared to an existing method of generating a metal vapor in a crucible, a large amount of metal vapor may be generated with less thermal loss, and a substrate or a steel sheet being continuously transferred (even at high speed) may be coated with the metal vapor.

As described above, to coat a steel sheet being continuously transferred under a vacuum, a heating apparatus (evaporating apparatus) is used for generating a coating vapor, and a coating material (to be evaporated for coating) is supplied for continuous coating.

A coating material may be supplied using a solid state (solid) supply method or a liquid state (liquid) supply method according to the state of the coating material, and examples of the liquid state supply method include a mechanical method, a height difference method, or a pressure difference method.

Examples of the mechanical method (liquid state supply method) include a piston method (US Patent Publication No. 2005-0229856), a magnetohydrodynamics (MHD) pump method using electromagnetism (Korean Patent Laid-open Publication No. 2007-0015923), and a screw supply method (Japanese Patent Laid-open Publication No. 2010-189739).

In addition, an example of the height difference method is disclosed in Korean Patent Laid-open No. 2009-0074064, and an example of the pressure difference method is disclosed in Japanese Patent Application Laid-open Publication No. S55-154537.

The liquid state supply methods disclosed in the above-mentioned patents have a common problem: equipment erosion (abrasion) caused by temperature or chemical properties of a supplied liquid material.

In an exemplary solid state (solid) supply method, a solid wire is supplied. In this case, however, the temperature of a vapor in an electromagnetic coil may be relatively low.

DISCLOSURE

Technical Problem

An aspect of the present disclosure may provide a heating apparatus. Initially, a coating material (medium) to be converted into a coating vapor is supplied to the heating apparatus in a solid phase (solid state), and then the solid coating material is phase changed (melted) into a liquid (liquid state). Thereafter, the liquid coating material is supplied to a heating unit of the heating apparatus, thus preventing problems such as the erosion of equipment occurring when a liquid coating material is directly supplied. Subsequently, the liquid coating material is converted into a coating vapor, thereby preventing the problem of a temperature decrease occurring in a coating material when a solid wire is supplied as a coating material. As a result, the energy efficiency of the heating apparatus may be maximized.

An aspect of the present disclosure may also provide a coating device including the heating apparatus for stably performing a high-quality continuous coating process on a base metal such as a steel sheet being transferred (at high speed).

Technical Solution

According to an aspect of the present disclosure, a heating apparatus may include: a heating unit configured to heat a supplied solid coating material to generate a coating vapor for coating a coating target object with the coating vapor; and a coating material supply unit connected to the heating unit for phase changing the solid coating material into a liquid coating material and supplying the liquid coating material to the heating unit.

According to another aspect of the present disclosure, a coating device may include: the heating apparatus; and a vacuum chamber partially or entirely surrounding the heating apparatus, wherein while a coating target object passes through the vacuum chamber in a vacuum state, the coating target object may be coated with a coating vapor generated by the heating apparatus.

Advantageous Effects

As described above, according to the present disclosure, a coating material to be converted into a coating vapor is first supplied in a solid state, and then the solid coating material is phase changed into a liquid coating material and supplied to the heating unit, thereby preventing damage such as equipment erosion occurring when a liquid coating material is directly supplied to the heating unit.

In addition, according to the present disclosure, a liquid coating material is converted into a coating vapor (deposition vapor), thereby preventing the problem of a temperature drop occurring in a coating material when a solid wire is supplied as a coating material.

Therefore, the energy efficiency of the heating apparatus may be maximized, and the coating device including the heating apparatus may stably perform a high-quality continuous coating process on a base metal such as a steel sheet which is being transferred at a high speed.

DESCRIPTION OF DRAWINGS

FIG. 1 is a view illustrating the overall structure of a coating device including a heating apparatus illustrated in FIG. 4, according to the present disclosure.

FIG. 2 is an enlarged view illustrating a portion of FIG. 1.

FIG. 3 is a view illustrating an embodiment of the heating apparatus according to the present disclosure.

FIG. 4 is a view illustrating another embodiment of the heating apparatus according to the present disclosure.

FIG. 5 is a view illustrating another embodiment of the heating apparatus according to the present disclosure.

FIG. 6 is a view illustrating another embodiment of the heating apparatus according to the present disclosure.

FIG. 7 is an overall view illustrating a coating device including the heating apparatus illustrated in FIG. 4, according to another embodiment of the present disclosure.

FIG. 8 is an overall view illustrating an exemplary modification of the coating device illustrated in FIG. 7, according to the present disclosure.

BEST MODE

Embodiments of the present disclosure will now be described in detail (with reference to the accompanying drawings). The disclosure may, however, be exemplified in many different forms and should not be construed as being limited to the specific embodiments set forth herein. Rather, these embodiments are provided so that this disclosure will be thorough and complete, and will fully convey the scope of the present invention to those skilled in the art (in the drawings, the shapes and dimensions of elements may be exaggerated for clarity).

FIGS. 1 and 2 illustrate a coating device 200 including a heating apparatus 1 illustrated in FIG. 4, according to an exemplary embodiment of the present disclosure. FIGS. 3 to 6 are views illustrating exemplary embodiments of the heating apparatus 1 according to the present disclosure. FIG. 7 is a view illustrating a coating device 200 including the heating apparatus 1 illustrated in FIG. 4 according to another exemplary embodiment of the present disclosure, and FIG. 8 is a view illustrating an exemplary modification of the coating device 200 illustrated in FIG. 7.

In the following description, the coating device 200 and the heating apparatus 1 illustrated in FIGS. 1 and 6 will be described according to exemplary embodiments of the present disclosure, and the coating device 200 illustrated in FIGS. 7 and 8 will be described according to another exemplary embodiment and a modification embodiment of the present disclosure.

In the coating device 200 illustrated in FIGS. 1 and 2, a coating target object, for example, a steel sheet 210, is coated while being horizontally transferred. In the coating device 200 illustrated in FIGS. 7 and 8, a steel sheet 210 is coated while being vertically transferred. The coating devices 200 may include any embodiment of the heating apparatus 1 described in detail with reference to FIGS. 3 to 6.

In the following descriptions of the exemplary embodiments of the present disclosure, a steel sheet 210 which is transferred (at high speed) may be a coating target object, and the term "coating material" may refer to a coating medium supplied as a coating vapor (gas) to be deposited and coated on the steel sheet 210. The term "coating material" will be used rather than the term "coating medium." In addition, a solid-state coating material may be referred to as a "solid coating material 10," a liquid-state coating material obtained by heating and phase changing (melting) the solid coating material 10 may be referred to as a "liquid coating material 12," and a deposition vapor (gas) obtained by heating the liquid coating material 12 may be referred to as a "coating vapor 14."

As illustrated in FIGS. 1, 2, 7, and 8, the solid coating material 10 may have an ingot (bar) shape having a predetermined size allowing the ingot to be easily transported and supplied. However, the solid coating material 10 is not limited thereto.

Next, unlike a wet coating device in which a steel sheet is coated while being dipped into a coating solution and passed through the coating solution, the coating device 200 of the exemplary embodiment illustrated in FIGS. 1 and 2 may be a dry coating device in which a coating vapor 14 is deposited on a surface of a steel sheet 210 under a vacuum so as to coat the steel sheet 210 with a desired material.

The coating device 200 of the present disclosure may include a vacuum chamber 220 hermetically sealing a heating unit 20 of the heating apparatus 1 and at least a portion of a coating material supply tube 62 of a coating material supply unit 60 (described in detail with reference to FIGS. 2 to 6).

In the vacuum chamber 220, transfer rolls 222 are disposed at an entrance side and an exit side for continuously transferring a coating target object such as a steel sheet 210 at high speed. In addition, the transfer rolls 222 may seal the entrance side and exit side of the vacuum chamber 220.

Therefore, in the coating device 200 of the present disclosure, a coating vapor 14 generated by the heating apparatus 1 is ejected through a nozzle hole 52 formed in a coating vapor nozzle tube 50 and deposited on a surface of a steel sheet 210 which is being transferred at a position close to the nozzle hole 52, thereby coating the steel sheet 210.

Next, the heating apparatus 1 will be described with reference to FIGS. 2 to 6 according to exemplary embodiments of the present disclosure.

The heating apparatus 1 includes the heating unit 20 heating a supplied solid coating material 10 to generate a coating vapor 14 and coat a steel sheet 210 with the coating vapor 14. For example, the solid coating material 10 is phase changed into, that is, melted into a liquid coating material 12 and then evaporated to form a coating vapor 14 by the heating unit 20.

The heating apparatus 1 of the present disclosure may solve the problem of equipment erosion (damage) occurring in the related art when a liquid coating material is directly supplied to equipment (such as a heating unit) and may prevent the temperature drop occurring in a coating material when a solid coating material such as a solid wire is supplied.

That is, ingots, which have predetermined sizes and are thus easy to handle and supply, are supplied as a solid coating material 10 to the heating unit 20, and in a state in which the solid coating material 10 is temporarily stopped by a coating material stopping structure of the heating apparatus 1, the solid coating material 10 is heated and phase changed to obtain a liquid coating material 12. Then, the liquid coating material 12 is supplied to a coating vapor generating tube 40 of the heating unit 20 to smoothly generate a coating vapor 14. Therefore, equipment erosion may be prevented because a liquid coating material is not first supplied, and the temperature drop occurring in a coating material when a solid coating material such as a wire is supplied may be prevented.

In addition, as illustrated in FIG. 2, the heating apparatus 1 of the present disclosure may include the coating material supply unit 60 which is connected to the heating unit 20 for changing a solid coating material 10 into a liquid coating material 12 along a coating material supply path and supplying the liquid coating material 12 to the heating unit 20.

In this case, the heating unit 20 of the heating apparatus 1 of the present disclosure may include: an electromagnetic coil 30 configured to heat a coating material by electromagnetic induction; and the coating vapor generating tube 40 disposed inside the electromagnetic coil 30 to generate a coating vapor 14 by heating a supplied liquid coating material 12.

In addition, the heating apparatus 1 of the present disclosure may further include the coating vapor nozzle tube 50 connected to the coating vapor generating tube 40 and having the nozzle hole 52 for continuously coating a steel sheet 210 by ejecting (discharging) a coating vapor 14 to the steel sheet 210.

Substantially, the coating vapor nozzle tube 50 may be considered as an element of the coating device 200.

That is, if power is applied to the electromagnetic coil 30 that may include an upper electromagnetic coil 32 having a predetermined number of turns and a lower electromagnetic coil 34 properly separate from the upper electromagnetic coil 32 and having a predetermined number of turns, the heating apparatus 1 of the present disclosure heats a coating material by using an electromagnetic current induced in the electromagnetic coil 30 so as to generate a coating vapor 14 for coating a steel sheet 210.

For example, if a high-frequency current is applied to the electromagnetic coil 30, electromagnetic force is generated inside the electromagnetic coil 30, and a solid coating material 10 supplied to the inside of the electromagnetic coil 30 is phase changed into a liquid coating material 12 by the electromagnetic force. Then, the liquid coating material 12 is heated inside the coating vapor generating tube 40 to generate a metal vapor as a coating vapor 14.

As illustrated in FIG. 1, a power supply 36 is connected to the upper and lower electromagnetic coils 32 and 34 of the electromagnetic coil 30, and the electromagnetic coil (high-frequency coil) 30 may be insulated with an insulator (not indicated with a reference numeral) such as a castable refractory or a ceramic filler so as to prevent the generation of arcs.

In addition, as illustrated in FIGS. 1, 2, 7, and 8, the electromagnetic coil 30, the coating vapor generating tube 40 disposed inside the electromagnetic coil 30, and the coating vapor nozzle tube 50 having the nozzle hole 52 and connected to an upper portion of the coating vapor generating tube 40 may be disposed inside the vacuum chamber 220. The reason for this is as follows. When a coating material is heated using electromagnetic force, a considerably large amount of heat is generated, and thus if the coating vapor generating tube 40 and the coating vapor nozzle tube 50 are exposed externally, arcs may be generated due to pollutant particles.

In addition, as illustrated in FIGS. 2 to 4, the coating material supply unit 60 of the heating apparatus 1 includes the coating material supply tube 62 hermetically inserted into one of the coating vapor generating tube 40 and the coating vapor nozzle tube 50 and connected to the inside of the tube.

In addition, the coating material supply tube 62 is inserted through a wall of the vacuum chamber 220 and connected to a coating material supply device 70 or 170 that will be described in detail with reference to FIGS. 1, 2, 7, and 8, so as to initially supply a solid coating material 10 to the inside of the coating vapor generating tube 40 in which a heating region of the heating unit 20 is formed.

In this case, although schematically illustrated in the drawings, the coating material supply tube 62 is inserted into the wall of the vacuum chamber 220 and one of the coating vapor generating tube 40 and the coating vapor nozzle tube 50 in a hermetically sealed state so as to prevent leakage of a coating vapor 14 or permeation of ambient air into the vacuum chamber 220.

Since the coating material supply tube 62 is connected to the heating unit 20 heating a solid coating material 10 by using electromagnetic force to generate a liquid coating material 12 and then a coating vapor 14 through phase changes, the coating material supply tube 62 may be formed of a heat resistant material such as graphite, usable at high temperatures.

In addition, as illustrated in FIGS. 4 to 6, the heating apparatus 1 of the present disclosure may include the coating material stopping structure configured to temporarily stop (fix the position of) a solid coating material 10 supplied from the coating material supply tube 62 of the coating material supply unit 60 for heating the solid coating material 10 by electromagnetic force and phase changing the solid coating material 10 into a liquid coating material 12.

As illustrated in FIG. 4, the coating material stopping structure may be a discharge tube 64 connected to a lower portion of the coating material supply tube 62 or formed in one piece with the lower portion of the coating material supply tube 62. The discharge tube 64 may support (stop) a supplied solid coating material 10 so that the solid coating material 10 may be heated and phase changed into a liquid coating material 12. Thereafter, the liquid coating material 12 may be supplied to the coating vapor generating tube 40.

In this case, as illustrated in FIGS. 4 and 5, the discharge tube 64 provided as a coating material stopping structure may be inserted into the lower portion of the coating material supply tube 62 or formed in one piece with the lower portion of the coating material supply tube 62, and since the discharge tube 64 is disposed in the region of the heating unit 20, the discharge tube 64 may be a hollow member formed of a heat resistant material such as graphite like the coating material supply tube 62 formed of a heat resistant material.

That is, the discharge tube 64 inserted into the lower portion of the coating material supply tube 62 or formed in one piece with the lower portion of the coating material supply tube 62 may form a stepped portion by the thickness of the discharge tube 64 so as to stop and support a supplied solid coating material 10 thereon.

Therefore, the solid coating material 10 is caught on an upper end of the discharge tube 64 in the coating material supply tube 62 and is heated by electromagnetic force applied thereto. Subsequently, the solid coating material 10 changes form (melts) into a liquid coating material 12, and the liquid coating material 12 is discharged (fed) to the coating vapor generating tube 40 in which the liquid coating material 12 is further heated to finally generate a coating vapor 14. The coating vapor 14 is deposited on a steel sheet 210 for coating the steel sheet 210 by a dry coating method.

According to the present disclosure, since a coating material is substantially levitated and heated inside the electromagnetic coil 30 of the heating apparatus 1, although only the coating material supply tube 62 is provided as illustrated in FIG. 3, a supplied solid coating material 10 may be levitated and heated by electromagnetic force to generate a liquid coating material 12 through a phase change, and then the liquid coating material 12 may be evaporated to form a coating vapor 14 in the coating vapor generating tube 40.

However, if only the coating material supply tube 62 is used as illustrated in FIG. 3, a relatively large electromagnetic force may have to be generated for levitating and heating a coating material.

Therefore, as illustrated in FIGS. 4 to 6, the discharge tube 64 may be provided on the lower portion of the coating material supply tube 62 as a stopping structure so as to support a solid coating material 10 inserted into the coating material supply tube 62 and fallen along the coating material supply tube 62 when the solid coating material 10 is heated and changed into a liquid coating material 12.

In addition, as illustrated in FIG. 5, if the discharge tube 64, being a stopping structure, is formed in one piece with the lower portion of the coating material supply tube 62 of the heating apparatus 1, the discharge tube 64 may include a support jaw 66 forming a stepped portion for stopping and supporting a solid coating material 10.

In this case, as illustrated in FIG. 5, the coating material supply tube 62 may include: a heat-resistant tube 62' formed of a heat-resistant material such as graphite and disposed in the vicinity of the heating unit 20, that is, the electromagnetic coil 30; and a supply tube 62" connected to an upper portion of the heat-resistant tube 62'.

For example, the supply tube 62" may be a metal tube, which may be relatively inexpensive as compared to a graphite tube.

In addition, as illustrated in FIG. 6, a different stopping structure may be used. That is, stopping jaws 62a and 64a configured to catch and support each other may be formed on a lower end of the coating material supply tube 62 and an upper end of the discharge tube 64 so as to stop a supplied solid coating material 10 by catching and supporting the supplied solid coating material 10.

That is, a supplied solid coating material 10 may be supported in a position at which the stopping jaws 62a and 64a are superposed and may be heated (by electromagnetic force) and phase changed into a liquid coating material 12. Then, the liquid coating material 12 may be discharged to the coating vapor generating tube 40.

In addition, as illustrated in FIG. 6, shock-absorbing members 68 such as shock-absorbing rings formed of a heat-resistant material may be disposed between the stopping jaws 62a and 64a of the coating material supply tube 62 and the discharge tube 64. The shock-absorbing rings may absorb impact force when a solid coating material 10 having an ingot shape falls along the coating material supply tube 62.

In addition, as illustrated in FIGS. 1, 2, 7, and 8, the coating material supply unit 60 of the heating apparatus 1 of the present disclosure may include the coating material supply device 70 or 170 connected to the coating material supply tube 62 for supplying a solid coating material 10 having an ingot (bar) shape to the heating unit 20 through the coating material supply tube 62.

The coating device 200 illustrated in FIGS. 1 and 2 and the coating devices 200 illustrated in FIGS. 7 and 8 are different depending on whether a steel sheet 210 is horizontal or vertically transferred. Therefore, different coating material supply devices 70 and 170 may be included in the coating device 200 of FIGS. 1 and 2 and the coating device 200 of FIGS. 7 and 8, respectively. However, exemplary structures of the coating material supply device 170 illustrated in FIGS. 7 and 8 are similar to each other.

That is, in the present disclosure, the coating material supply device 70 may be used in a case in which a steel sheet 210 is horizontally transferred as illustrated in FIGS. 1 and 2, and the coating material supply device 170 may be used in a case in which a steel sheet 210 is vertically transferred as illustrated in FIGS. 7 and 8.

First, referring to FIG. 2, the coating material supply device 70, according to an exemplary embodiment, includes a cylindrical casing 72 disposed at a side of the vacuum chamber 220 of the coating device 200, and a circular rotary feeder 76 is rotatably disposed in the casing 72 in connection with an upper motor 75. In addition, a plurality of coating material pockets 74 are formed at predetermined intervals in the circular rotary feeder 76.

Therefore, as illustrated in FIGS. 1 and 2, ingots of a solid coating material 10 continuously transferred at predetermined intervals along a belt conveyor 92 of a transfer device 90 may be sequentially inserted into the pockets 74 of the circular rotary feeder 76 through a hole (not indicated by a reference numeral) in the casing 72, and as the circular rotary feeder 76 is rotated, the ingots of the solid coating material 10 may be supplied to the heating unit 20 through a discharge hole 78 formed in a bottom surface of the casing 72.

In addition, like the coating device 200 described with reference to FIGS. 1 and 2, the coating device 200 illustrated in FIGS. 7 and 8 according to other exemplary embodiments may include the coating material supply unit 60 of the heating apparatus 1, the coating vapor generating tube 40 of the heating unit 20, and the coating vapor nozzle tube 50 having the nozzle hole 52 that is described in detail with reference to FIGS. 3 to 6.

If a wide steel sheet is horizontally transferred as illustrated in FIGS. 1 and 2, the steel sheet may be deformed. Therefore, a wide steel sheet may have to be coated while being vertically transferred as illustrated in FIGS. 7 and 8.

In a case in which a steel sheet is coated with a coating vapor 14 while being vertically transferred, the coating vapor nozzle tube 50 connected to the coating vapor generating tube 40 surrounded by the electromagnetic coil 30 of the heating unit 20 may be curved or bent in a direction corresponding to the steel sheet so that the nozzle hole 52 of the coating vapor nozzle tube 50 may face the steel sheet, and a solid coating material 10 may be supplied to the heating unit 20 through the coating material supply tube 62 of the coating material supply unit 60 in a downward direction, unlike the case illustrated in FIGS. 1 and 2.

Furthermore, in the embodiment and modification embodiment illustrated in FIGS. 7 and 8, the coating material supply device 170 may include a rotary stack 176 rotatably disposed in a cylindrical housing 172 and having coating material pockets 174 to accommodate ingots of a solid coating material 10.

The rotary stack 176 may have a multiple stack structure or a one-piece vertical structure through which a plurality of coating material pockets 174 are vertically formed.

That is, as illustrated in FIGS. 7 and 8, the cylindrical housing 176 of the coating material supply device 170 may have a vertically extending cylindrical structure in which the coating material pockets 174 are formed to receive ingots of a coating material 10 through a hole (not indicated with a reference numeral) formed in an upper side of the housing 172 and stack the received ingots in multiple layers.

Therefore, if a coating material (ingot) 10 falls through a solid coating material discharge hole 178 formed in a hollow casing 177 which is installed on a support 173 disposed on a vacuum chamber 220, a pushing part 192 attached to a rod of a cylinder 190 horizontally disposed in the casing 177 is operated to push the solid coating material 10 to an opposite side of the casing 177 at which an upper entrance of the coating material supply tube 62 is located, and then the solid coating material 10 supplied to the inside of the coating material supply tube 62 is caught and supported by the discharge tube 64 described as a stopping structure with reference to FIGS. 4 to 6. In this state, the solid coating material 10 is heated and phase changed into a liquid coating material 12, and then the liquid coating material 12 is further heated to generate a coating vapor 14.

For this, as illustrated in FIG. 7, the rotary stack 176 may include a rotation shaft 171 which is coupled to the housing 172, for example, using bearings, and is rotatable by a belt (chain) 179 connected to a motor 175. Thus, the rotary stack 176 may sequentially supply ingots of the solid coating material 10 to the coating material supply tube 62 while being rotated by a predetermined amount per rotation.

Alternatively, as shown in FIG. 8, the rotation shaft 171 of the rotary stack 176 may be directly connected to a motor 175 disposed on an upper portion of the housing 172 and may be rotated by the motor 175.

That is, the configurations of the coating material supply device 170 illustrated in FIGS. 7 and 8 are different in terms of the driving mechanism of the rotary stack 176 and the arrangement of the cylinder 190 and the pushing part 192.

In addition, as illustrated in FIGS. 1, 2, 7, and 8, the heating apparatus 1 of the present disclosure may further include a supply tube blocking unit 80 to prevent a coating vapor 14 from leaking through the coating material supply tube 62.

For example, as shown in FIG. 2, the supply tube blocking unit 80 may include a movable blocking part 84 configured to be moved by a driving unit 82 such as a cylinder and block a hole 63 of the coating material supply tube 62.

Alternatively, as illustrated in FIGS. 7 and 8, the supply tube blocking unit 80 may include a blocking plate 84' connected to a lower portion of a driving unit 82 such as a cylinder and configured to cover the upper entrance of the coating material supply tube 62 extending in a vertical direction.

In this case, the movable blocking part 84 illustrated in FIG. 2 may have a function of pushing a solid coating material 10 into the coating material supply tube 62 and a function of closing the hole 63 of the coating material supply tube 62.

The blocking plate 84' illustrated in FIGS. 7 and 8 has a function of closing the upper entrance (hole) of the coating material supply tube 62.

According to the present disclosure, a solid coating material 10 is heated and phase changed into a liquid coating material 12 while being supported on the discharge tube 14 provided as a stopping structure of the coating material supply tube 62, and the liquid coating material 12 flows downward through a lower discharge hole of the discharge tube 14 to the coating vapor generating tube 40 in which the liquid coating material 12 is phase changed into a coating vapor 14. Therefore, the coating material supply tube 62 or the discharge tube 64 may be plugged with the solid coating material 10, and thus the coating vapor 14 may scarcely leak through the coating material supply tube 62 even though the movable blocking part 84 or the blocking plate 84' is not used.

In addition, as illustrated in FIGS. 1, 7, and 8, the electromagnetic coil 30 of the heating apparatus 1 of the coating device 200 may be disposed in the vacuum chamber 220 (refer to FIG. 1) or outside the vacuum chamber 220 (refer to FIGS. 7 and 8).

In a case in which the electromagnetic coil 30 is disposed outside the vacuum chamber 220, the electromagnetic coil 30 may surround an insulative flange 230 (having a wall structure) disposed between the vacuum chamber 220 and the electromagnetic coil 30. The insulative flange 230 may be a wall structure surrounding the coating vapor generating tube 40 of the heating unit 20 in which a vacuum is formed and separating the coating vapor generating tube 40 from the electromagnetic coil 30 exposed to the atmosphere.

According to the present disclosure, in the heating apparatus 1 of the coating device 200 in which only the coating material supply tube 62 of the coating material supply unit 60 is provided, as illustrated in FIG. 3, or the discharge tube 64 functioning as a stopping structure is provided on the lower portion of the coating material supply tube 62, as illustrated in FIGS. 4 to 6, the lower end of the coating material supply tube 62 or the discharge tube 64 may be located between the upper electromagnetic coil 32 and the lower electromagnetic coil 34 of the electromagnetic coil 30 of the heating unit 20 so as to smoothly generate a liquid coating material 12 by phase changing a solid coating material 10.

For example, Tables 1 and 2 show numerical data indicating a relationship among an applied current, the distance between the uppermost turn of the lower electromagnetic coil 34 and the lower end of the coating material supply tube 62 or the discharge tube 64, and the amount of heat generation. Table 1 shows data in the case in which the upper electromagnetic coil 32 has two turns and the lower electromagnetic coil 34 has five turns, and Table 2 shows data in the case in which the upper electromagnetic coil 32 has three turns and the lower electromagnetic coil 34 has five turns.

TABLE 1

(Here, the upper electromagnetic coil 32 has two turns and the lower electromagnetic coil 34 has five turns)

| | C | | | | | | | | | | | |
|---|---|---|---|---|---|---|---|---|---|---|---|---|
| | 2.0 [kA] | | | | 2.5 [kA] | | | | 3.0 [kA] | | | |
| | D [mm] | | | | | | | | | | | |
| | 0 | 50 | 100 | 150 | 0 | 50 | 100 | 150 | 0 | 50 | 100 | 150 |
| Q [kW] | 5.21 | 2.29 | 1.68 | 0.459 | 8.13 | 3.58 | 2.6 | 0.775 | 11.7 | 5.15 | 3.74 | 1.12 |

C: current,
D: distance,
Q: amount of heat generation

TABLE 2

(Here, the upper electromagnetic coil 32 has three turns and the lower electromagnetic coil 34 has five turns)

| | C | | | | | | | | | | | |
|---|---|---|---|---|---|---|---|---|---|---|---|---|
| | 2.0 [kA] | | | | 2.5 [kA] | | | | 3.0 [kA] | | | |
| | D [mm] | | | | | | | | | | | |
| | 0 | 50 | 100 | 150 | 0 | 50 | 100 | 150 | 0 | 50 | 100 | 150 |
| Q [kW] | 7.11 | 5.99 | 3.45 | 0.96 | 11.1 | 9.35 | 5.39 | 1.5 | 16 | 13.5 | 7.77 | 2.16 |

C: current,
D: distance,
Q: amount of heat generation

Referring to Table 1, when a current of 3 kA is applied and the distance between the uppermost turn of the lower electromagnetic coil 34 and the lower end of the discharge tube 64 or the coating material supply tube 62 is 0 mm, the amount of heat generation has a maximum value of 16 kW.

In this case, although a steel sheet 210 is transferred at a high speed of about 200 mpm, a coating vapor 14 may be sufficiently deposited on the steel sheet 210, and thus the steel sheet 210 may be smoothly coated.

That is, as shown in Tables 1 and 2, when the distance between the lower electromagnetic coil 34 and the lower end (lower edge) of the coating material supply tube 62 or the discharge tube 64 is 0 mm, the amount of heat generation is highest, and a larger amount of heat is generated when the upper electromagnetic coil 32 has three turns (refer to Table 2) than when the upper electromagnetic coil 34 has two turns (refer to Table 1).

Referring to Tables 1 and 2, if a steel sheet 210 having a width of 1550 mm is coated with zinc to a thickness of about 2 μm while the steel sheet 210 is being transferred at a speed of 100 mpm, about 2.5 kg of a solid coating medium 10 may be initially supplied at intervals of about 10 sec. The solid coating medium 10 may be heated to 400° C. by electromagnetic force, and in this case, heating energy of about 4 kw may be used for generating a liquid coating medium 12 through phase change.

Therefore, in the heating apparatus 1 of the present disclosure, the lower edge of the coating material supply tube 62 (refer to FIG. 3) or the discharge tube 64 (refer to FIG. 4) of the coating material supply unit 60 may be disposed at least between the upper electromagnetic coil 32 and the lower electromagnetic coil 34.

In addition, if the discharge tube 64 is excessively long, a solid coating material 12 supported by the upper end of the discharge tube 64 in the coating material supply tube 62 may not be close to the electromagnetic coil 30. That is, the length of the discharge tube 64 may be adjusted such that the discharge tube 14 may be inserted into the coating material supply tube 62 and a liquid coating material 12 may be discharged from the discharge tube 64.

The thickness of the coating material supply tube 62 (formed of graphite) of the coating material supply unit 60 may be 0.3 times to 1.5 times the electromagnetic skin depth of the coating material supply tube 62.

For example, the efficiency of electromagnetic induction heating is highest when the thickness of a metal conductor in which an induced current flows is 0.3 times the electromagnetic surface depth, that is, electromagnetic skin depth of the metal conductor. Therefore, preferably, the thickness of the coating material supply tube 62 having a cylindrical shape may be adjusted to be 0.3 times to 1.5 times the electromagnetic skin depth of the coating material supply tube 62. However, if the thickness of the coating material supply tube 62 is equal to or greater than 1.5 times the electromagnetic skin depth, an electromagnetically induced current may not be easily distributed.

The outer diameter of the coating material supply tube 62 of the coating material supply unit 60 may be 5% to 20% of the inner diameter of the coating vapor generating tube 40 of the heating unit 20. For example, if the outer diameter of the base plate 61 is equal to or less than 5% of the inner diameter of the coating vapor generating tube 40, the amount of heat generation at the coating material supply tube 62 may be excessively low, and thus it may be difficult to change the phase of (melt) a solid coating material 10, and if the outer diameter of the base plate 61 is equal to or greater than 20% of the inner diameter of the coating vapor generating tube 40, the flow of a coating vapor 14 generated from a liquid coating material 12 may be disturbed.

Therefore, it may be preferable that that the outer diameter of the coating material supply tube 62 be within the range of 5% to 20% of the inner diameter of the coating vapor generating tube 40.

INDUSTRIAL APPLICABILITY

As described above, according to the present disclosure, the heating apparatus 1 and the coating device 200 constituted based on the heating apparatus 1 may not have the problem of equipment erosion (abrasion) occurring when a liquid coating material is initially supplied as a coating material nor the problem of a temperature drop occurring in a coating material when a solid wire is supplied as a coating material. Particularly, since a solid coating material is initially supplied and the solid coating material is phase changed into a liquid coating material and then a coating vapor, the coating vapor may be effectively generated, and a coating process may be easily and efficiently performed.

While exemplary embodiments have been shown and described above, it will be apparent to those skilled in the art that modifications and variations could be made without departing from the scope of the present disclosure as defined by the appended claims.

The invention claimed is:

1. A heating apparatus comprising:
   a heating unit configured to heat a supplied solid coating material to generate a coating vapor for coating a coating target object with the coating vapor; and
   a coating material supply unit connected to the heating unit for phase changing the solid coating material into a liquid coating material and supplying the liquid coating material to the heating unit, and
   wherein the heating unit comprises:
      an electromagnetic coil configured to heat the liquid coating material by electromagnetic induction; and
      a coating vapor generating tube disposed inside the electromagnetic coil for converting the liquid coating material into the coating vapor,
   wherein the coating material supply unit comprises:
      a coating material supply tube extending from an outside of the coating vapor generating tube to an inside of the coating vapor generating tube, and along which the solid coating material is supplied;
      a coating material stopping structure disposed on a lower portion of the coating material supply tube and inside the electromagnetic coil to hold the solid coating material while the solid coating material is heated and phase changed into the liquid coating material by the electromagnetic coil, and then to discharge the liquid coating material into the inside of the coating vapor generating tube, and
      shock-absorbing members,
      wherein the coating material stopping structure comprises a discharge tube inserted into the lower portion of the coating material supply tube for supporting the solid coating material and discharging the liquid coating material to the coating vapor generating tube after the solid coating material is heated and phase changed into the liquid coating material, the shock-absorbing members are disposed between the coating material supply tube and the discharge tube.

2. The heating apparatus of claim 1, wherein the heating apparatus further comprises a coating vapor nozzle tube connected to the coating vapor generating tube and comprising a nozzle hole through which the coating vapor is ejected to the coating target object.

3. The heating apparatus of claim 1, wherein the coating material supply tube comprises a heat-resistant tube disposed in the heating unit.

4. The heating apparatus of claim 1, wherein the coating material supply unit further comprises a coating material supply device connected to the coating material supply tube for sequentially supplying the solid coating material to the coating material supply tube.

5. The heating apparatus of claim 4, wherein the coating material supply device comprises:
   a rotary feeder rotatably disposed in a casing and comprising at least one coating material pocket to sequentially receive the solid coating material; and
   a discharge hole formed in a bottom surface of the casing to sequentially supply the solid coating material to the coating material supply tube through the discharge hole.

6. The heating apparatus of claim 4, wherein the coating material supply device comprises:
   a rotary stack rotatably disposed in a housing and comprising a coating material pocket to receive the solid coating material in multiple layers; and
   a casing disposed under the housing and horizontally connected to a cylinder for supplying the solid coating material to the coating material supply tube, the casing communicating with the coating material supply tube.

7. The heating apparatus of claim 1, further comprising a supply tube blocking unit configured to cover an entrance of the coating material supply tube or close a hole formed in the coating material supply tube.

8. The heating apparatus of claim 1, wherein the lower portion of the coating material supply tube of the coating material supply unit or a lower end of the discharge tube provided on the lower portion of the coating material supply tube is located between upper and lower electromagnetic coils of the heating unit.

9. A coating device comprising:
   the heating apparatus of claim 1; and
   a vacuum chamber partially or entirely surrounding the heating apparatus, wherein while the coating target object passes through the vacuum chamber in a vacuum state, the coating target object is coated with the coating vapor generated by the heating apparatus.

10. The coating device of claim 9, wherein the coating target object passing through the vacuum chamber is a steel sheet, and the heating apparatus and the vacuum chamber are arranged such that the steel sheet is coated while being horizontally or vertically transferred.

11. The heating apparatus of claim 1, wherein the coating material stopping structure further comprises stopping jaws respectively provided on a lower end of the coating material supply tube and an upper end of the discharge tube and configured to catch and support each other and support the solid coating material.

* * * * *